United States Patent
Song et al.

[11] Patent Number: 6,042,649
[45] Date of Patent: Mar. 28, 2000

[54] POLYIMIDE COATING DEVICE HAVING A POLYIMIDE SUPPLY STATUS SENSING DEVICE

[75] Inventors: Kyung-suu Song; Tae-sin Park; Tae-un Lim; Sung-il Jung, all of Yongin, Rep. of Korea

[73] Assignee: Samsung Electronics Co., Ltd., Suwon, Rep. of Korea

[21] Appl. No.: 08/900,355

[22] Filed: Jul. 25, 1997

[30] Foreign Application Priority Data

Jul. 27, 1996 [KR] Rep. of Korea ............ 96-30880

[51] Int. Cl.[7] ............................................. B05C 11/00
[52] U.S. Cl. ..................... 118/684; 118/692; 118/712; 422/110; 422/111; 422/119; 422/133
[58] Field of Search .................... 118/684, 692, 118/712; 422/110, 111, 119, 133; 200/81.9 R, 81.9 M; 340/606, 608; 73/290

[56] References Cited

U.S. PATENT DOCUMENTS

| | | | |
|---|---|---|---|
| Re. 36,050 | 1/1999 | Thakur et al. ........................ | 374/161 |
| 4,672,997 | 6/1987 | Landis et al. ......................... | 137/554 |
| 5,288,325 | 2/1994 | Gomi .................................... | 118/692 |
| 5,776,255 | 7/1998 | Asaba et al. .......................... | 118/726 |

FOREIGN PATENT DOCUMENTS

| | | |
|---|---|---|
| 61-164998 | 7/1986 | Japan . |
| 62-37923 | 3/1987 | Japan . |
| 8-45816 | 2/1996 | Japan . |

*Primary Examiner*—Jeff H. Aftergut
*Attorney, Agent, or Firm*—Jones Volentine, L.L.P.

[57] ABSTRACT

A polyimide coating device includes a bubble sensor for sensing the supply of a polyimide from a main polyimide storage tank. The coating device also includes an auxiliary storage tank filled with a predetermined amount of polyimide at all the times. A discharge pipe is connected to the auxiliary storage tank such that any gas introduced into a supply pipe between the main storage tank and the auxiliary storage tank is easily discharged prior to the polyimide entering a reaction chamber.

9 Claims, 3 Drawing Sheets

POLYIMIDE COATING DEVICE HAVING A POLYIMIDE SUPPLY STATUS SENSING DEVICE

BACKGROUND OF THE INVENTION

1. Field of the Invention

The present invention relates to a device for coating a polyimide of a semiconductor device, and more particularly, to a polyimide coating device including a means for preventing the unnecessary consumption of the polyimide.

2. Description of the Related Art

A polyimide is one of materials used as an interlayer insulating film in a semiconductor device manufacturing process. The polyimide is a fluid in contrast to other interlayer insulating films such as oxide or nitride films.

Since the polyimide is a fluid, when a structure having a severe step difference is coated with the polyimide, the surface of the step difference portion is smoothed over. As a result, the step difference can be reduced, and a narrow channel having a high aspect ratio can be filled without forming a void. Once hardened, a polyimide does not change its material properties even at temperatures over 500° C.

The polyimide characteristics can vary with a particular polyimide coating application. That is, the smoothing characteristics are not evident where poor coatings exist, such as when foam or small gas bubbles are resident in a coated polyimide film.

Referring to FIG. 1, a conventional polyimide coating device generally includes a polyimide storage tank 10 and a plurality of pipe lines 16, 20 and 22 connected to the polyimide storage tank 10, each pipe line having a different function.

More specifically, the polyimide storage tank 10 is an opaque airtight tank containing a vessel 14 filled with a polyimide 12. A polyimide supply pipe 16 is connected to the vessel 14 for supplying the polyimide to a reaction chamber (not shown) via a pressure differential. In effect, the polyimide is forced into the polyimide supply pipe 16 by increasing the inner pressure of the storage tank 10. A gas, for example, nitrogen, is used as a means for increasing the pressure inside the storage tank 10, and accordingly, a nitrogen supply pipe 22 is connected to the storage tank 10. In addition, an air valve 24 communicates with the storage tank 10 to keep the pressure of the storage tank 10 constant.

An intermediate valve 18 is installed in the polyimide supply pipe 16 for blocking and discharging the polyimide 12 supplied from the storage tank 10. A discharge pipe 20 connects to the intermediate valve 18 for discharging the polyimide 12. The intermediate valve 18 serves as an interlocking valve so that the supply and discharge of the polyimide is performed consecutively. That is, when the intermediate valve 18 operates to supply the polyimide 12 to the reaction chamber, a passage leading to the discharge pipe 20 closes. On the other hand, when the intermediate valve 18 opens the discharge pipe 20 to discharge the polyimide 12, a passage leading to the supply pipe 16 closes.

With this conventional configuration, since the storage tank 10 is opaque, it is difficult to determine the amount of polyimide 12 remaining in the vessel 14. Thus, the conventional polyimide coating device monitors the coating frequency, or number of coating applications performed, using a counter. If the coating frequency reaches a predetermined value, the polyimide 12 stored in the storage tank 10 is considered low and the polyimide vessel 14 is then replaced with a new one. In general, when the counter reaches a value of 120, the polyimide 12 in the vessel 14 is considered low and the vessel is replaced.

However, since the polyimide coating amount for each application can vary slightly, the amount of polyimide 12 remaining in the vessel 14 may be sufficient even after reaching the designated count value. On the other hand, the polyimide 12 may be exhausted prior to reaching the designated count value.

In the conventional polyimide coating device, when the predetermined frequency count is reached, the intermediate valve 18 automatically opens the discharge pipe 20. Since, the inside of the storage tank 10 cannot be seen, one cannot accurately determine the amount of polyimide 12 within the storage tank 10, and the discharge pipe 20 discharges all the remaining polyimide 12 in the storage tank 10.

On the other hand, when the polyimide 12 supply is exhausted before reaching the predetermined frequency count, a gas is introduced into the supply pipe 16. This gas remains within the supply pipe 16 even after the polyimide 12 is replaced. In such cases, when the polyimide 12 is supplied into the supply pipe 16, foams or small bubbles are generated in the polyimide 12 by the gas, thereby forming a polyimide film that is coated on a substrate, but which has the gas bubbles resident therein. When such a polyimide film is thereafter baked or thermal-treated, the bubbles burst, thus roughing the surface of the polyimide film and rendering the film useless.

In either of the above situations, manufacturing costs increase. In one case the remaining polyimide is wasted by discharging it prematurely, and in the other case, poor quality films are formed. In both cases, polyimide is unnecessarily wasted.

SUMMARY OF THE INVENTION

The present invention provides a polyimide coating device that is capable of preventing the unnecessary waste of polyimide, as well as preventing the production of poor quality films by accurately sensing the remaining amount of the polyimide and replacing the polyimide at an optimum time.

To accomplish these and other objects, the present invention provides for a polyimide coating device with a main storage tank containing polyimide to be supplied to a reaction chamber. A polyimide supply pipe is connected to the main storage tank and a gas supply pipe is connected to the main storage tank for supplying a gas to increase an inner pressure of the main storage tank. A valve is also connected to the main storage tank for controlling the inner pressure of the main storage tank. A sensing device is installed on the polyimide supply pipe for sensing whether a flow of polyimide from the main storage tank to the reaction chamber is discontinued or not.

The present invention further includes an auxiliary polyimide storage tank installed on the polyimide supply pipe between the sensing device and the reaction chamber. A discharge pipe is connected to the auxiliary storage tank for discharging gas bubbles formed within the auxiliary storage tank. A discharging valve is installed on the discharge pipe for selectively controlling the discharge of the gas bubbles to the outside.

The sensing device may be a gas bubble sensor having a circuit for sensing the presence or absence of gas bubbles within the polyimide supply pipe. An audible and/or visual alarm may be connected to the output terminal of the sensing circuit to generate an alarm to alert the operator of the equipment that the polyimide supply is exhausted.

With the polyimide coating device of the present invention, the amount of polyimide remaining in the main storage tank can be easily determined without disrupting the polyimide supply process, thus minimizing the amount of polyimide that is discharged prematurely. Also, since any gas introduced during the replacement of the polyimide is discharged from an intermediate portion of the supply pipe, gas bubbles are not formed in the polyimide emitted from the nozzle that forms the polyimide film on the semiconductor substrate. Accordingly, further unnecessary consumption of the polyimide is precluded by preventing poor coatings from being formed during the polyimide coating process. Since the polyimide is more efficiently used, the amount of polyimide that must be purchased is reduced, thereby reducing the semiconductor device manufacturing cost.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Figure 1:
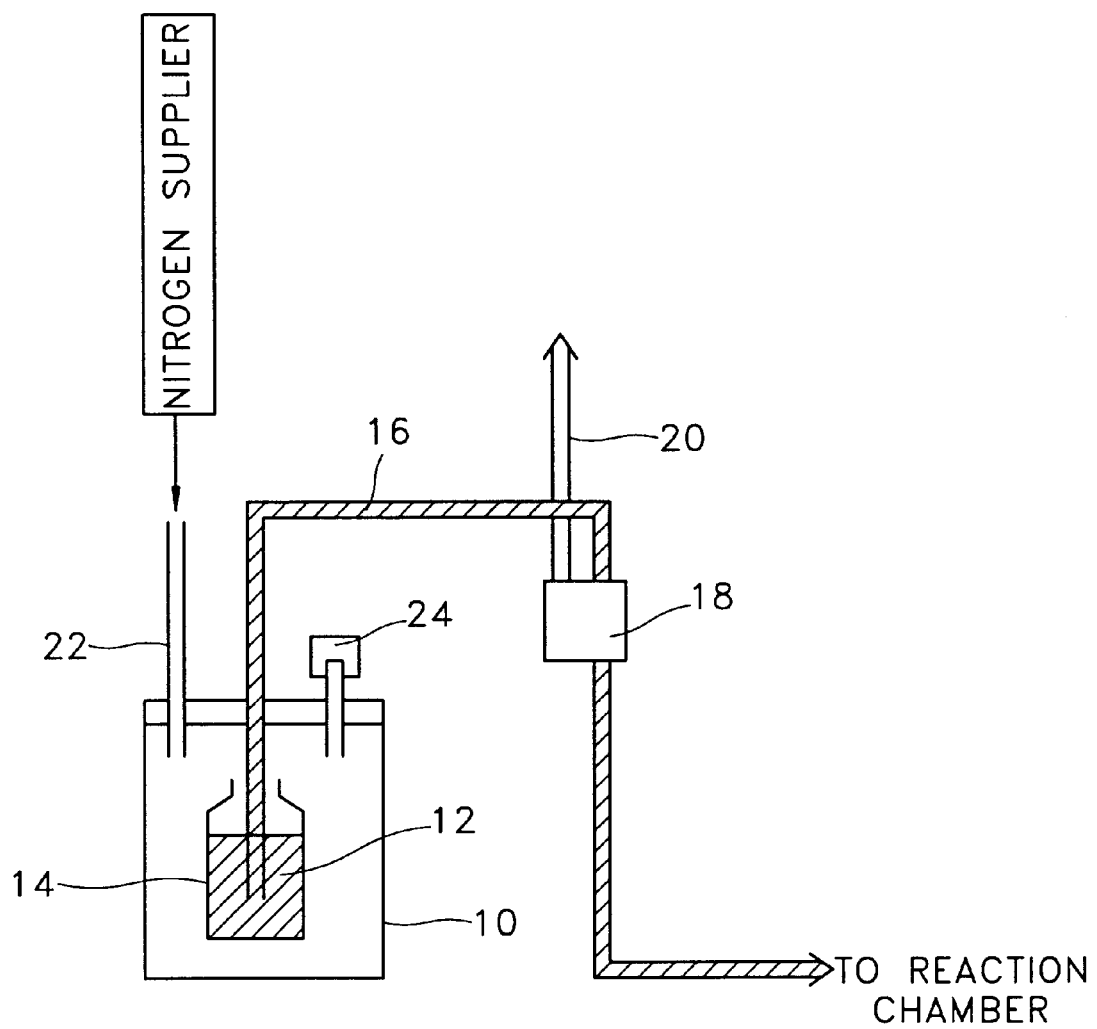
FIG. 1 is a sectional view of a conventional polyimide coating device.
Figure 2:
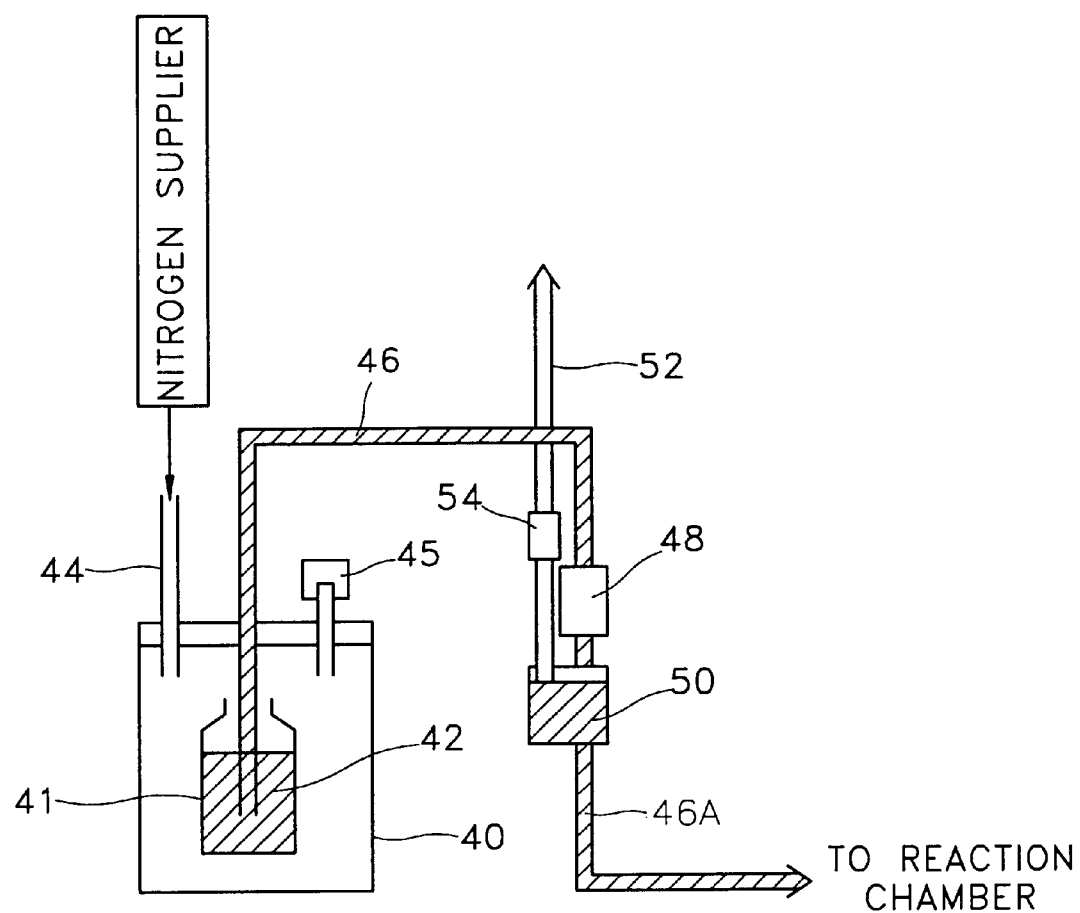
FIG. 2 is a sectional view of a polyimide coating device according to the present invention.

Referring to FIG. 2, a polyimide coating device according to an embodiment of the present invention generally includes two polyimide storage tanks, namely, a main storage tank 40 and an auxiliary storage tank 50, and a plurality of pipe lines 44, 46 and 52.

More specifically, a polyimide supply pipe 46 connects to a vessel 41 containing a polyimide 42, which is installed in the main storage tank 40. The polyimide supply pipe 46 supplies the polyimide 42 to a substrate located within a reaction chamber (not shown).

The main storage tank 40 is an airtight tank, and the polyimide 42 is supplied from the main storage tank 40 to the reaction chamber via a pressure differential. More specifically, a gas supply pipe 44 is connected to the main storage tank 40 to supply a gas, preferably nitrogen, although other gases are contemplated, to increase the inner pressure of the main storage tank 40 to a predetermined value or greater. When the polyimide 42 is pushed out of the main storage tank 40 by the pressure of the nitrogen gas, the inner pressure of the main storage tank 40 is lowered. Accordingly, an air valve 45 communicates with the main storage tank 40 to keep the inner pressure of the main storage tank 40 constant.

A sensing device 48 senses whether the supply of the polyimide 42 from the main storage tank 40 is discontinued or not. The sensing device 48 is installed along the polyimide supply pipe 46. An exemplary sensing device 48 may be a bubble sensor, which is ordinarily "on" when the polyimide 42 is flowing, and "off" when the polyimide 42 supply in the main storage tank 40 is exhausted. When the supply of the polyimide 42 from the main storage tank 40 stops, the bubble sensor visually and/or audibly signals such an "off" state to an operator using an alarm device (e.g., a buzzer) or an alarm light device (e.g., a light emitting diode (LED)). The alarms may be adhered to the body of the bubble sensor 48 itself, or placed at another location closer to the operator or supervisor. Thus, when the alarm is activated, the polyimide coating operation can be promptly discontinued and the appropriate time for replacing the polyimide can be determined exactly.

There may be a slight delay between the time the operator is alerted that the polyimide is completely drained from the main storage tank 40 and the operator actually stops the polyimide coating device. In order to prevent the formation of gas bubbles in the polyimide film during this brief interval, an auxiliary storage tank 50 is installed along a polyimide supply pipe 46A, between the sensing device 48 and the reaction chamber. The auxiliary storage tank 50 is always filled with a predetermined amount of polyimide 42.

The polyimide 42 contained in this auxiliary storage tank 50 is supplied to the reaction chamber during the interval when the sensing device 48 activates an alarm and when the polyimide coating device is actually shut down. Therefore, even though the supply of the polyimide from the polyimide vessel 42 in the main storage tank 40 is discontinued, the supply pipe 46A between the auxiliary storage tank 50 and the reaction chamber is always filled with the polyimide 42, thereby preventing gas bubbles from entering the inside of the supply pipe 46A between the auxiliary storage tank 50 and the reaction chamber and degrading the polyimide film. The efficiency of the polyimide coating process is enhanced, and the unnecessary consumption of the polyimide is prevented.

As shown in FIG. 2, a discharge pipe 52 is connected to the auxiliary storage tank 50, and any gas that was introduced during the replacement of the polyimide 42 is discharged through the discharge pipe 52. More specifically, any gas that flowed into the supply pipe 46 while the polyimide 42 was being replaced, now flows through the sensing device 48 to the auxiliary storage tank 50, along with the polyimide 42 that is now flowing from the main storage tank 40. Since there is a given amount of polyimide in the auxiliary storage tank 50 at all the times, the gas flowing to the auxiliary storage tank 50 does not flow to the supply pipe 46A. Rather, it is collected at the upper portion of the auxiliary storage tank 50, and then discharged to the outside via the discharge pipe 52. A discharge valve 54 is installed on the discharge pipe 52 so that the gas discharge process can be controlled.

Figure 3:
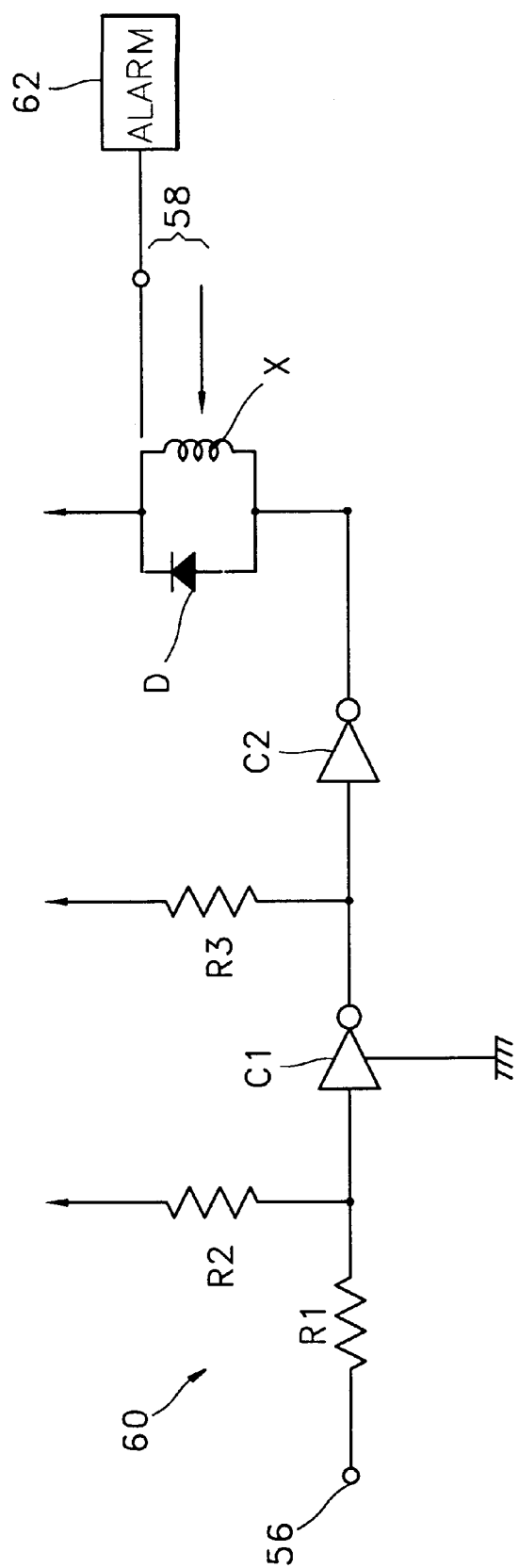
FIG. 3 is a circuit diagram of a bubble sensor and alarm of the polyimide coating device according to the present invention.

FIG. 3 illustrates a sensing circuit 60 in the bubble sensor 48. As shown in FIG. 3, the bubble sensor circuit 60 is generally comprised of three resistors R1, R2, and R3, two inverters C1 and C2, a diode D, and a reactor X.

More specifically, a first end of the first resistor R1 connects to an input terminal 56 of the bubble sensor circuit. In the present embodiment, the first resistor R1, for example, has a resistance value of 3.3 kΩ. The second end of the first resistor R1 connects to an input of the first inverter C1. A first end of the second resistor R2 is connected between the second end of the first resistor R1 and the input of the first inverter C1. A predetermined voltage, e.g., a direct current (DC) voltage of at least 5 volts (V), is applied to the second end of the second resistor R2. In the present embodiment, the second resistor R2, for example, has a resistance value of 10 kΩ.

The first inverter C1 is grounded, and has its output connected to the input of the second inverter C2. Also, a first end of the third resistor R3 is connected between the output of the first inverter C1 and the input of the second inverter C2. A DC voltage of about at least 5V is applied to the second end of the third resistor R3. In the present embodiment, the third resistor R3, for example, has a resistance value of 10 kΩ.

An anode of the diode D and a first end of the reactor X are connected in parallel to the output of the second inverter C2. A predetermined DC voltage (e.g., 5 V) is applied to a cathode of the diode D and the second end of the reactor X. The diode D and the reactor X are connected in parallel with each other.

An output terminal 58 can be formed by connecting an end of the reactor X to an arbitrary position on the reactor X. An alarm 62, for example, an audible buzzer or visual alarm such as a light emitting diode (LED), would be connected to the output terminal 58 to indicate a desired state to the operator.

The alarm 62 operates as follows. A voltage measuring unit is connected to the output terminal 58 of the reactor X, and the voltage of the reactor X is measured by this unit. A switch on the alarm 62 device that is connected to the output terminal 58 is turned on using the measured voltage. Note that the portion of the reactor X that is connected to the output terminal 58 can be arbitrarily changed. Thus, the particular voltage measured from the reactor X will vary with a change in position on the reactor X.

The operation of the bubble sensor circuit 60 will now be described. First, the operation of the bubble sensor circuit 60 will be described when a low voltage of 5V or below is applied to the signal input terminal 56. The low voltage situation may be selected to identify when the bubble sensor senses the gas bubbles or when it does not. For this discussion, we will assume the low voltage case is when the bubble sensor senses the gas bubbles.

When a low voltage of less than 5V is applied to the input terminal 56, and since a voltage of 5V is applied to the second end of the second resistor R2, current flows through the first resistor R1. The low voltage is then applied to the input of the first inverter C1 and a high voltage is thus applied across the output of the first inverter C1. The same high voltage applied across the output of the first inverter C1 is applied to the input of the second inverter C2, and therefore, a low voltage is applied across the output of the second inverter C2. The low voltage that is applied across the output of the second inverter C2 is simultaneously applied to the anode of the diode D and the first end of the reactor X, which are connected in parallel to the second inverter C2.

However, since a 5V voltage is simultaneously applied across the cathode of the diode D and the second end of the reactor X, the diode D is reverse-biased (off), and therefore, current does not flow through the diode D, but rather flows through the reactor X. Accordingly, a voltage is measured from the output terminal 58 connected to the reactor X and a switch (not shown) is turned on using the measured voltage, whereby an alarm 62 is activated indicating the presence of gas bubbles.

The exhaustion of the polyimide 42 in the main storage tank 40 can thus be easily recognized through the alarm 62. As previously described, even though the main storage tank 40 is completely drained, since a given amount of polyimide is housed in the auxiliary storage tank 50 (see FIG. 2), gas bubbles are prevented from flowing to the supply pipe 46A connected to the nozzle, even though the main supply of polyimide is stopped. The gas bubbles generated in the auxiliary storage tank 50 are discharged through the discharge pipe 52 before reopening the main supply of the polyimide.

Returning to FIG. 3, the operation of the bubble sensor circuit 60 will now be described when a high voltage is applied (i.e., the normal case where gas bubbles are not present). The high voltage of 5V or more applied to the input terminal 56 also appears at the input of the first inverter C1. A low voltage is thus applied across the output of the first inverter C1 and this same low voltage is applied to the input of the second inverter C2. Accordingly, a high voltage is applied to the output of the second inverter C2. This same high voltage is simultaneously applied to the anode of the diode D and one end of the reactor X. However, since a high voltage of about 5V is simultaneously applied to the cathode of the diode D and the other end of the reactor X, the diode D is forward-biased and current flows through the diode D rather than the reactor X. Thus, the alarm 62 is not activated, indicating that a sufficient amount of polyimide exists in the main storage tank 40 of FIG. 2, and the polyimide supply continues smoothly.

As described above, the alarm 62 is generated when the input signal of the input terminal 56 falls below 5V from a state where a voltage of 5V or above had been applied. As stated previously, the circuit 60 may be configured such that the alarm 62 is generated when the input signal of the input terminal 56 rises above 5V from a state where a voltage of 5V or less had been applied. For example, normal operations may be indicated when the light (alarm 62) is ON, and the occurrence of gas bubbles would be indicated by the light being OFF. The converse is also true. Normal operations may be indicated when the light (alarm 62) is OFF, and the occurrence of gas bubbles would be indicated by the light being ON. The important thing is the change in the signal input to the input terminal, not the actual value of the input signal.

Since the present invention includes the bubble sensor 48 and the auxiliary storage tank 50, the supply state of the polyimide 42 in the main storage tank 40 can be easily sensed, thus minimizing the amount of polyimide that is discharged prematurely. Also, since any gas introduced during the replacement of the polyimide is discharged from an intermediate portion of the supply pipe, gas bubbles are not formed in the polyimide emitted from the nozzle that forms the polyimide film on the semiconductor substrate. Accordingly, further unnecessary consumption of the polyimide can be prevented by preventing poor coatings from being formed during the polyimide coating process. Since the polyimide is more efficiently used, the amount of polyimide that must be purchased is reduced, thereby reducing the semiconductor device manufacturing cost.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A polyimide coating device comprising:

a main storage tank for containing polyimide to be supplied to a reaction chamber;

a polyimide supply pipe connected to the main storing tank;

a gas supply pipe for connecting to the main storage tank for supplying a gas to increase an inner pressure of said main storage tank;

a valve connected to said main storage tank for controlling the inner pressure of said main storage tank;

a sensing device installed on the polyimide supply pipe for sensing whether a flow of polyimide from said main storage tank is discontinued or not;

an auxiliary polyimide storage tank installed on the polyimide supply pipe between the sensing device and the reaction chamber; and a discharge pipe connected to the auxiliary storage tank for discharging gas bubbles formed within the auxiliary storage tank.

2. The polymide coating device of claim 1, wherein the sensing device is a gas bubble sensor.

3. The polyimide coating device of claim 2, wherein the bubble sensor includes a circuit comprising:

a first resistor connected at a first end to an input terminal to which a signal is input, said input signal changing depending on the presence or absence of gas bubbles within the polyimide supply pipe;

a first inverter having an input connected to a second end of the first resistor;

a second resistor having a first end connected between the second end of the first resistor and the input of the first inverter, and a second end to which a direct current (DC) voltage of at least about 5V is applied;

a second inverter having an input connected to an output of the first inverter;

a third resistor having a first end connected between the output of the first inverter and the input of the second inverter, and a second end to which a predetermined DC voltage of at least about 5V is applied;

a diode having an anode connected to the output of the second inverter and a cathode to which a predetermined voltage of about 5V is applied;

a reactor having a first end connected in parallel with the diode to the output of the second inverter, and a second end to which a predetermined voltage of about 5V is applied; and an output terminal connected to the second end of the reactor at an arbitrary position of the reactor.

4. The polyimide coating device of claim 3, wherein a voltage measured at the output terminal is variable, depending on the arbitrary position of the reactor.

5. The polyimide coating device of claim 3, further comprising an alarm device connected to the output terminal to generate an alarm.

6. The polyimide coating device of claim 5, wherein said alarm device is an audible alarm.

7. The polyimide coating device of claim 5, wherein said alarm device is a visual alarm.

8. The polyimide coating device of claim 7, wherein said visual alarm is a light emitting diode (LED).

9. The polyimide coating device of claim 1, wherein said gas for increasing the inner pressure of the main storage tank is a nitrogen gas.

* * * * *